United States Patent
Alberto et al.

(10) Patent No.: US 11,828,803 B2
(45) Date of Patent: Nov. 28, 2023

(54) METHOD FOR TESTING CAPACITIVE CURRENT SWITCHING OF A CIRCUIT BREAKER

(71) Applicant: Schneider Electric Industries SAS, Rueil-Malmaison (FR)

(72) Inventors: Diego Alberto, Corenc (FR); Jean-Pierre Gauthier, Vourey (FR); Anthony Papillon, Grenoble (FR); Xavier Godechot, Jacou (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 289 days.

(21) Appl. No.: 17/194,388

(22) Filed: Mar. 8, 2021

(65) Prior Publication Data
US 2021/0286006 A1    Sep. 16, 2021

(30) Foreign Application Priority Data
Mar. 13, 2020 (FR) ..................... 2002516

(51) Int. Cl.
*G01R 31/327* (2006.01)
*G01R 31/333* (2006.01)

(52) U.S. Cl.
CPC ..... *G01R 31/3274* (2013.01); *G01R 31/3333* (2013.01)

(58) Field of Classification Search
CPC .................... G01R 31/3274; G01R 31/333
See application file for complete search history.

(56) References Cited

U.S. PATENT DOCUMENTS

| 6,713,984 B1 * | 3/2004 | Valdemarsson | H01H 33/36 318/560 |
| 8,994,438 B2 * | 3/2015 | Gediga | H03K 17/14 327/434 |
| 9,543,748 B2 * | 1/2017 | Andersen | H02H 7/26 |
| 2009/0189615 A1 * | 7/2009 | Kinsel | H02H 1/0015 324/537 |

(Continued)

FOREIGN PATENT DOCUMENTS

DE    1181322 B    11/1964

OTHER PUBLICATIONS

Sili Yao et al., "Discussion on the Problem about Capacitive Current Switching of EHV and UHV AC Circuit Breaker", 2017 4th International Conference on Electric Power Equipment—Switching Technology—Xi'an-China, IEEE, Oct. 22, 2017, pp. 771-777.

(Continued)

*Primary Examiner* — Jeff W Natalini
(74) *Attorney, Agent, or Firm* — Locke Lord LLP

(57) ABSTRACT

A method for testing capacitive current switching of a circuit breaker, including:
- realizing a capacitive current switching by the circuit breaker,
- measuring voltage at the terminals of the circuit breaker after the capacitive current switching,
- calculating the gradient of the measured voltage,
- determining whether there is at least one point of gradient whose amplitude exhibits an absolute value greater than a first predetermined threshold, and when such a point is determined,
- identifying the instant of appearance of the determined point and of the amplitude of variation of the voltage at that instant, as voltage drop.

9 Claims, 8 Drawing Sheets

(56) References Cited

U.S. PATENT DOCUMENTS

2015/0326120 A1* 11/2015 Kelin .................... H02M 3/156
                                                    323/282
2016/0301200 A1* 10/2016 Niehoff ................. H02H 3/021
2018/0284193 A1* 10/2018 Wandres ............. G01R 31/327

OTHER PUBLICATIONS

Gaetan Daigneault et al., "Comparing Direct and Synthetic Tests for Interruption of Line-Charging Capacitive Current", IEEE Transactions on Power Delivery, vol. 16, No. 3, Jul. 1, 2001, pp. 409-414.
Shui-Cheong Kam et al., "A Circuit-Breaker Restrike Diagnostic Algorithm Using ATP and Wavelet Transforms", Universities Power Engineering Conference (AUPEC), 2011 21st Australasian, IEEE, Sep. 25, 2011, 6 pages.
French Search Report and Written Opinion for French Patent Application No. FR2002516 dated Nov. 30, 2020, 10 pages.

\* cited by examiner

METHOD FOR TESTING CAPACITIVE CURRENT SWITCHING OF A CIRCUIT BREAKER

TECHNICAL FIELD

The present invention relates to circuit breakers and, more particularly, the field of endurance testing capacitive current switching of a circuit breaker.

STATE OF THE PRIOR ART

When considering electrical equipment, for example an electrical line or a battery of capacitors, the phenomenon of capacitive current appears when the electrical equipment is powered up. This is a permanent alternating current which passes through the capacitance of the electrical equipment between phase and earth.

It is known practice to provide protection for the electrical equipment by implementing circuit breakers. The circuit breakers are tested by current making and breaking tests which are defined notably by the international standard IEC (International Electrotechnical Commission) 62271-100 or the standard IEEE (Institute of Electrical and Electronics Engineers) C37.100.2. The aim of these tests is to demonstrate the performance levels of a medium voltage and/or high voltage alternating current circuit breaker.

Of these tests, interest is focused on those concerning the making and the breaking of capacitive currents. The most typical cases of application are the powering up and powering down of overhead lines in no-load conditions (open circuit at the other end), of cables in no-load conditions and of batteries of capacitors.

During the life of a circuit breaker, the number of capacitive current switching operations that it has to perform can be for example several thousand in the case of everyday operations. It is therefore desirable to have a test station which allows a large number, typically 10000, of capacitive switching operations to be performed. In each of the test results, transient phenomena, which are very rapid voltage drops, are sought. The phenomena sought are rare and relatively difficult to detect. It is therefore essential to identify these very rapid voltage drops.

A test campaign therefore involves a large number of tests and a processing of the measurement results to detect transient phenomena which are by their nature random.

SUMMARY OF THE INVENTION

The invention aims to resolve the problems of the prior art by providing a method for testing capacitive current switching of a circuit breaker, characterized in that it comprises steps of:
  realisation of a capacitive current switching by the circuit breaker,
  measurement of voltage at the terminals of the circuit breaker after the capacitive current switching,
  calculation of the gradient of the measured voltage,
  determination as to whether there is at least one point of gradient whose amplitude exhibits an absolute value greater than a first predetermined threshold, and when such a point is determined,
  identification of the instant of appearance of the determined point and of the amplitude of variation of the voltage at that instant, as voltage drop.

By virtue of the invention, it is possible to test the capacitive current switching capacity of a circuit breaker, so as to be able to qualify it, carry out predictive maintenance or even measure the effects of ageing on its capacitive current switching performance levels. The invention more particularly makes it possible to detect the very rapid voltage drops that correspond to restrikes. It is thus possible to assess the restrike faults of the circuit breaker.

According to a preferred feature, the voltage is measured with a sampling frequency greater than 10 MHz. Thus, the phenomena sought which are very rapid can be detected.

According to a preferred feature, the step of calculation of the gradient of the measured voltage comprises a high-pass filtering of the measured voltage.

According to a preferred feature, the circuit breaker comprising several phases, the method being performed for each phase, the method comprises the additional steps of:
  interpolation of the voltage measurement values at the terminals of the circuit breaker after the instant of voltage drop, to obtain a voltage curve, for each phase,
  calculation of a recharge time of the voltage curve obtained, for each phase,
  comparison of the recharge time of the voltage curve obtained with a predetermined recharge time, for each phase,
  identification of a phase for which there is a match between the calculated recharge time and the predetermined recharge time.

According to an alternative preferred feature, the circuit breaker comprising several phases, the method being performed for each phase, the method comprises the additional steps of:
  comparison of the absolute value of the amplitude of gradient for each point determined for each phase, with a second predetermined threshold,
  identification of a phase for which the absolute value of the amplitude of gradient at the determined point is greater than the second predetermined threshold.

Thus, for a multiphase circuit breaker, it is possible to discern the phase for which a very rapid voltage drop corresponding to a restrike occurs and the phase or phases that suffer only a crosstalk effect.

The invention relates also to a station for testing capacitive current switching of a circuit breaker, characterized in that it comprises:
  electrical modules suitable for performing a capacitive current switching by the circuit breaker,
  a data acquisition and processing chain suitable for measuring the voltage at the terminals of the circuit breaker after the capacitive current switching, to calculate the gradient of the measured voltage, to determine whether there is at least one point of gradient whose amplitude exhibits an absolute value greater than a first predetermined threshold, and when such a point is determined, and to identify the instant of appearance of the determined point and the amplitude of variation of the voltage at that instant, as voltage drop.

According to a preferred feature, the station for testing capacitive current switching of a circuit breaker comprises:
  an electrical module for creating the inrush current,
  an electrical module for creating the capacitive current,
  an electrical module for creating the recovery voltage after a capacitive switching,
  a synchronisation module for synchronising the above electrical modules.

According to a preferred feature, the electrical module for creating the recovery voltage after a capacitive switching comprises a source of low voltage with adjustable amplitude and frequency, a step-up transformer and a rectifying circuit.

In a particular embodiment, the station for testing capacitive current switching of a circuit breaker comprises a computer. Computer is understood to mean a programmable information processing system, for example a processing module, notably allowing the method according to the invention to be carried out.

The steps of the method according to the invention, notably the steps E3 to E8, are implemented by computer program instructions.

Consequently, the invention also targets a computer program on an information medium, this program being capable of being implemented in a computer, this program comprising instructions suitable for implementing the steps of a method as described above.

This program can use any programming language, and be in the form of source code, object code, or intermediate code between source code and object code, such as in a partially compiled form, or in any other desirable form.

The invention also targets a computer-readable information medium, comprising computer program instructions suitable for implementing the steps of a method as described above.

The information medium can be any entity or device capable of storing the program. For example, the medium can comprise a storage means, such as a ROM, for example a CD ROM or a microelectronic circuit ROM, or even a magnetic storage means, for example a floppy disk or a hard disk.

On the other hand, the information medium can be a transmissible medium such as an electrical or optical signal, which can be conveyed via an electrical or optical cable, by radio or by other means. The program according to the invention can in particular be downloaded over a network of internet type.

Alternatively, the information medium can be an integrated circuit in which the program is incorporated, the circuit being suitable for executing or for being used in the execution of the method according to the invention.

BRIEF DESCRIPTION OF THE DRAWINGS

Other features and advantages will become apparent on reading the following description of a preferred embodiment given as a nonlimiting example, described with reference to the figures in which.

Parts that are identical, similar or equivalent in the various figures bear the same numeric references so as facilitate the transition from one figure to another.

The various parts represented in the figures are not necessarily represented to a uniform scale, to make the figures more legible.

The various possibilities (variants and embodiments) should be understood to be not mutually exclusive and can be combined with one another.

DETAILED DESCRIPTION OF PARTICULAR EMBODIMENTS

Figure 1:
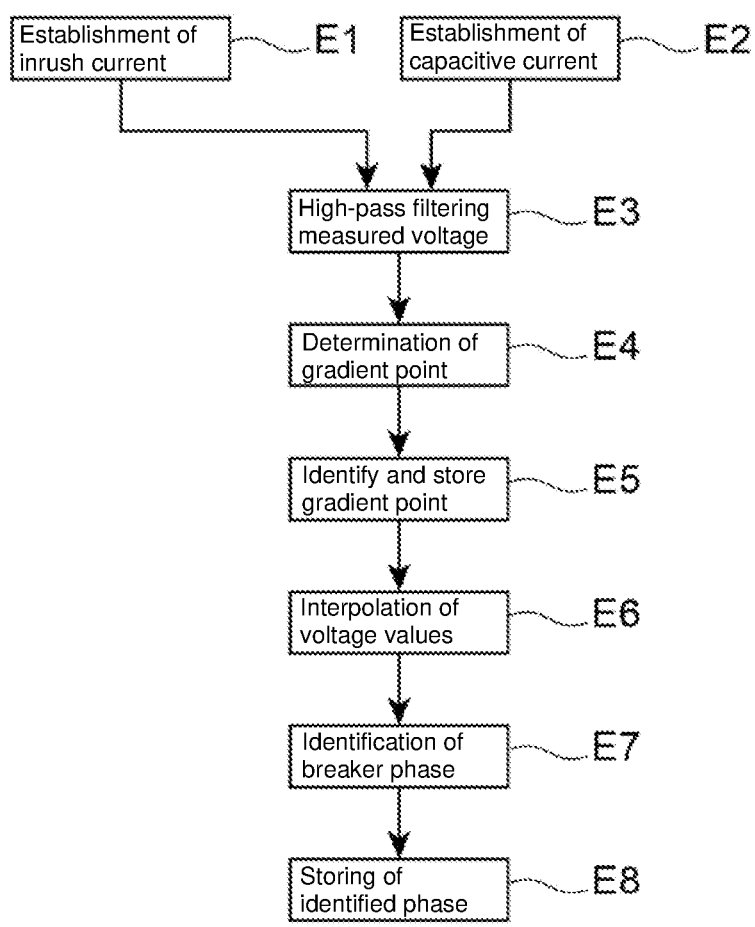
FIG. 1 illustrates a method for testing capacitive current switching of a circuit breaker, according to an embodiment of the invention.

According to a preferred embodiment, represented in FIG. 1, the method for testing capacitive current switching of a circuit breaker comprises steps E1 to E8 which are applied to a circuit breaker to access its capacitive current switching capacity.

The method is implemented in a test station provided to supply an adjustable inrush current, for example between 2 and 20 kA, and voltages for example between 10 and 52 kV as medium voltage and higher voltage values as high voltage. The station for testing capacitive current switching of a circuit breaker comprises two main parts:
 a capacitive test station, and
 a data acquisition and processing chain for performing measurements with high accuracy.

The station for testing capacitive current switching of a circuit breaker is described in more detail hereinbelow.

The circuit breaker being studied is more particularly a vacuum circuit breaker. It can also be an SF6 (sulfur hexafluoride) circuit breaker.

The phenomena measured are very rapid voltage drops. It is therefore necessary to measure them with a high sampling frequency, for example of at least 10 MHz. These very rapid voltage drops are measured, stored and counted.

It should be noted that, for a multiphase circuit breaker, the measurements are performed phase by phase to detect the very rapid voltage drop on each phase. As detailed hereinbelow, the results obtained on the different phases are compared to determine which phase has undergone a phenomenon of very rapid voltage drops corresponding to a restrike, so as to discriminate between the restrike phenomena and the crosstalk effects.

It is assumed that a circuit breaker has been arranged in test conditions in the test station. The circuit breaker is placed in an electrical circuit so as to be in a position to be able to switch a capacitive current.

The step E1 is the establishment of the inrush current.

The step E2 is the establishment of the capacitive current followed by the switching of this capacitive current, then the appearance of the recovery voltage, with the voltage measurement at the terminals of the circuit breaker during the capacitive current switching and above all during the appearance of the recovery voltage.

For a multiphase circuit breaker, the measurements are performed phase by phase. The measurement results are stored.

Figure 2:
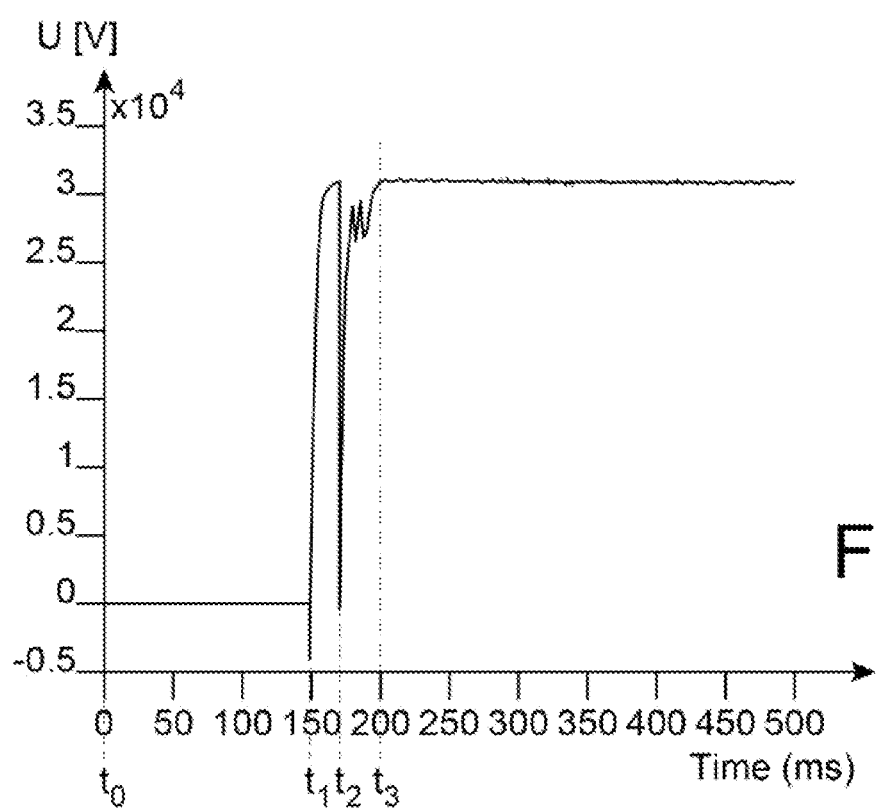
FIG. 2 illustrates an example of voltage measured at the terminals of a phase of a circuit breaker when the latter switches a capacitive current.

FIG. 2 represents an example of voltage measured at the terminals of a phase of a circuit breaker when the latter switches a capacitive current.

In the example represented, the voltage is zero between the instants $t_0=0$ and $t_1=150$ ms. From the instant $t_1=150$ ms corresponding to the opening of the circuit breaker, the voltage increases rapidly to a value of approximately 30 kV. At the instant $t_2$ of approximately 170 ms, the voltage exhibits a very rapid drop during which its value becomes substantially zero. Between the instant $t_2$ and the instant $t_3$ of approximately 200 ms, the value of the voltage rises back to 30 kV with a few oscillations. Finally, from the instant $t_3$, the value of the voltage remains substantially equal to 30 kV.

The phenomenon studied is the very rapid voltage drop appearing around 170 ms. This is a transient phenomenon, so it is necessary to perform the measurements with a high sampling frequency, typically greater than 10 MHz, or greater than 20 MHz, or even greater than 30 MHz.

The next step E3 is a high-pass filtering of the measured voltage to reveal the rapid phenomena and eliminate the slow variations of the signal. The high-pass filtering is performed for each phase in case of voltage acquisitions for several phases.

The high-pass filtering of the measured voltage is for example performed by calculation of the gradient, or even drift, of the measured voltage.

Figure 3:
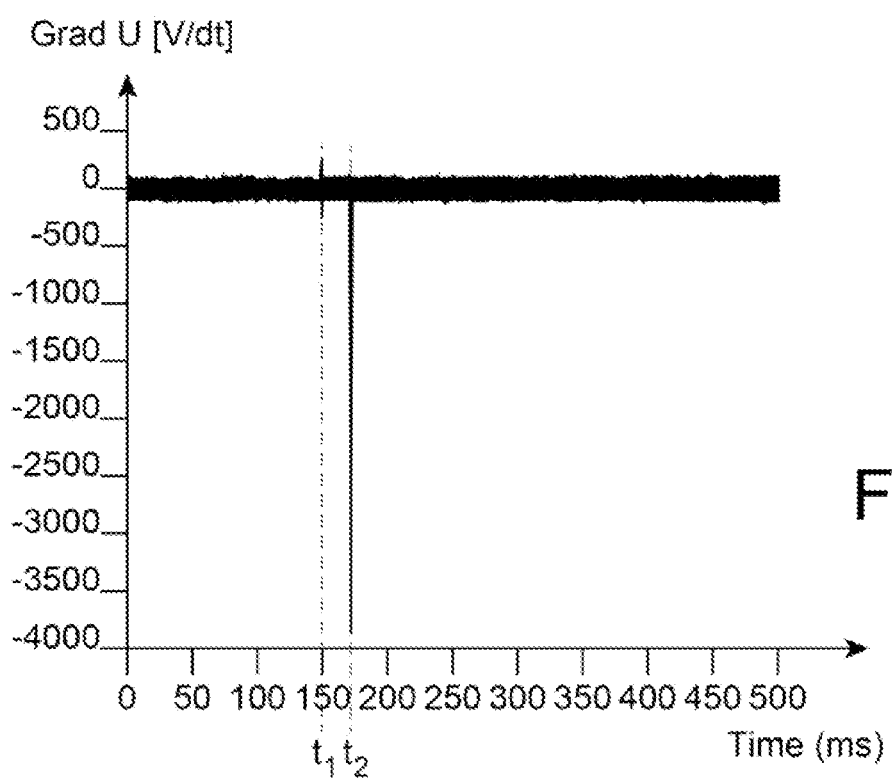
FIG. 3 illustrates the gradient of the voltage represented in FIG. 2.

FIG. 3 represents the gradient of the voltage represented in FIG. 2. The gradient remains within a range of values centred on zero, except at the instants $t_1$ and $t_2$. In this figure, it can be seen that the gradient of the voltage exhibits a first peak at the instant $t_1$ corresponding to the opening of the circuit breaker.

It can also be seen that the gradient of the voltage exhibits a second peak at the instant $t_2$.

The next step E4 is the determination as to whether there is at least one point of gradient whose amplitude exhibits an absolute value greater than a first predetermined threshold. This threshold depends preferably on the power of the noise.

In the example of FIG. 3, the second peak is identified as responding positively to the test of the step E4.

In this case, that is to say when such a point is determined, the step E4 is followed by the step E5 which is the identification and storing of the instant $t_2$ of appearance of the determined point and of the amplitude of variation of the voltage at that instant, as very rapid voltage drop.

The identified and stored phenomenon is a restrike of the circuit breaker.

In the case where the circuit breaker comprises several phases, the preceding steps E2 to E5 are conducted for each phase.

In a campaign of capacitive endurance testing of a circuit breaker comprising several phases, it may be that the voltage signals exhibit synchronous abrupt variations on several phases due to crosstalk effects.

"Crosstalk effect" or even "mirror effect" is understood to mean that a very rapid voltage drop on one phase also leads to a very rapid voltage drop on the other phases due to the capacitive coupling between phases, even though there has not been any restrike on the other phases.

Figure 4:
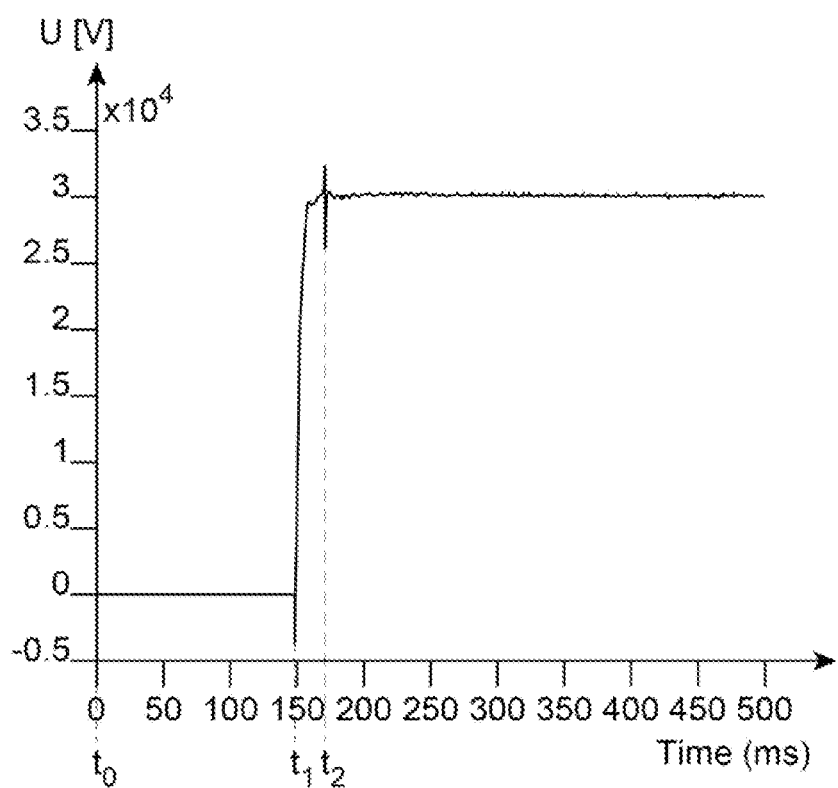
FIG. 4 illustrates another example of voltage measured at the terminals of a phase of a circuit breaker when the latter switches a capacitive current.

To illustrate this phenomenon, FIG. 4 represents the voltage measured at the terminals of a phase of the circuit breaker other than that represented in FIG. 2, this other phase undergoing crosstalk effects, when the circuit breaker switches a capacitive current.

In the example represented, the voltage is zero between the instants t0=0 and t1=150 ms. From the instant t1=150 ms corresponding to the opening of the circuit breaker, the voltage increases rapidly to a value of approximately 30 kV.

At the instant t2 of approximately 170 ms, the voltage exhibits a very rapid drop, of a lower amplitude than that, at the same instant, of the voltage represented in FIG. 2. From the instant t2, the value of the voltage stabilises around 30 kV with a few oscillations.

It should be noted that the voltage drops provoked by crosstalk effects do not degrade the circuit breaker and should therefore be excluded from the analysis. In such cases, to be able to distinguish the true restrike phenomena and crosstalk effects due to the capacitive coupling between phases, a classification and a more detailed analysis are necessary.

According to a first variant embodiment, the method comprises the following additional steps E6 to E8.

The step E6 is the interpolation of the voltage values just after the very rapid voltage drop, that is to say during the voltage rise, to obtain a voltage curve. Given that this voltage rise is exponential (capacitor recharge law), the recharge times on each phase of the circuit breaker are estimated, and they are compared with a predetermined recharge time T which is a function of the configuration of the test station.

The predetermined recharge time T corresponds to the product of an equivalent overall resistance $R_{eq}$ and of an equivalent capacitance $C_{eq}$ of the test station used to test the circuit breaker.

$$\tau = R_{eq} * C_{eq}$$

Figure 5:
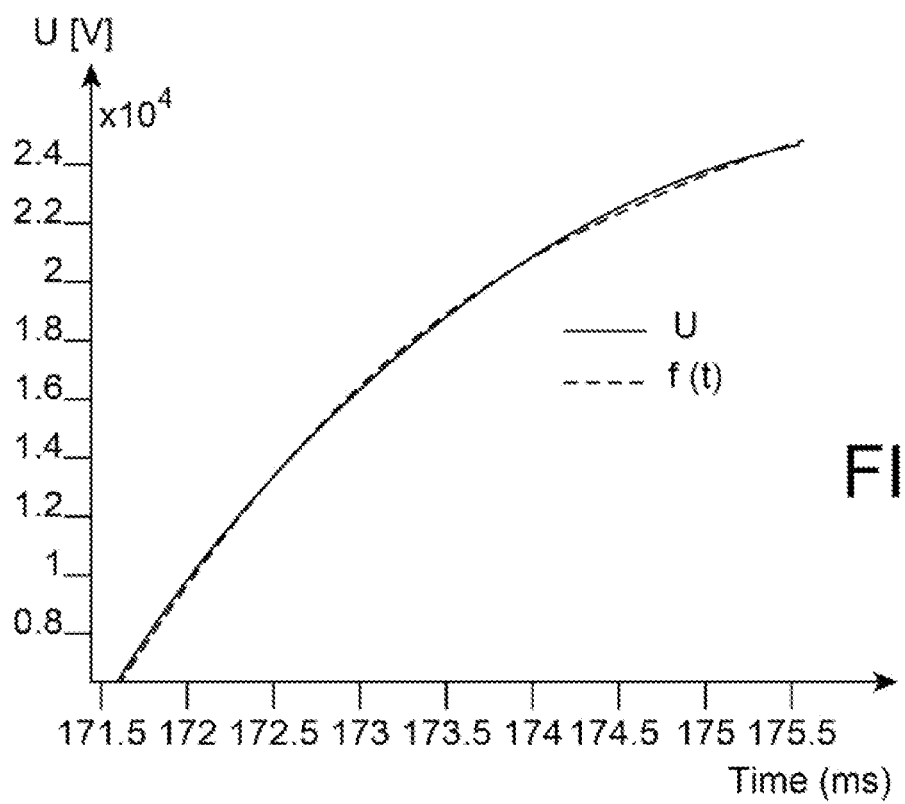
FIG. 5 illustrates the recharging of the voltage represented in FIG. 2.

FIG. 5 represent the recharging of the voltage represented in FIG. 2, between the instants 171.5 ms and 175.5 ms.

The recharge time for the phase that has actually undergone a very rapid voltage drop phenomenon, as opposed to a crosstalk effect due to the capacitive coupling between phases, is close to that of the test station.

Thus, the recharge curve illustrated in FIG. 5 can be modelled by an equation of the type:

$$f(t) = -a \cdot e^{-t/\tau 1} + c$$

in which t represents the time, a and c are constants and $\tau 1$ is the recharge time. The curve representing the function f(t) is plotted in dotted lines.

For the phase that has actually undergone a very rapid voltage drop phenomenon, the recharge time $\tau 1$ is substantially equal to the predetermined recharge time $\tau$.

For the phases that have undergone a crosstalk effect, the recharge time $\tau 1$ is substantially different from the predetermined recharge time $\tau$.

A second parameter that makes it possible to quantify the quality of the interpolation is the quality of the adjustment—typically greater than 99%.

It should be noted that, when the detection in the step E4 is performed only on one phase, the step E6 of interpolation is nevertheless carried out, whether it be in a single-phase case, or in a multiphase case in which a very rapid voltage drop is detected only on one phase. That makes it possible to distinguish a true restrike from a noise phenomenon.

The next step E7 is the identification of the phase for which there is a match between the recharge time of the circuit breaker after a rapid voltage drop with the predetermined recharge time, as a function of the result of the step E6.

The next step E8 is the storing of the result of the step E7.

If the type of product to be tested is known and few hundreds of voltage measurements have already been acquired, it is possible to dispense with the interpolation step. Thus, according to a second variant embodiment, the method then comprises the following additional steps E6 to E8.

The step E6 is a comparison of the absolute value of the amplitude of gradient for each point determined for each phase, with a second predetermined threshold. The second gradient threshold is defined by analysing the available measurements. This threshold makes it possible to rule on the nature of the phenomenon detected and, in the case of synchronous detections on several phases, to discriminate between the genuine very rapid voltage drops and the crosstalk effects.

The next step E7 is the identification of a phase for which the absolute value of the amplitude of gradient at the determined point is greater than the second predetermined threshold. This phase is that which has undergone a genuine restrike fault. The other phases, for which the absolute value of the amplitude of gradient at the determined point is less than the second predetermined threshold, have undergone crosstalk effects.

In other words, for one of the phases, the voltage variation is greater than for the others. The voltage gradient for that phase has a greater amplitude than that of the other phases.

The next step E8 is the storing of the result of the step E7.

The steps described previously are repeated a large number of times during a circuit breaker test campaign.

It should be noted that the time interval between two consecutive faults detected is taken into account. Indeed, each restrike fault detected which follows a preceding restrike fault with a time interval less than a period of time substantially equal to the recharge time of the test station is considered to be the same phenomenon as the preceding fault.

Figure 6:
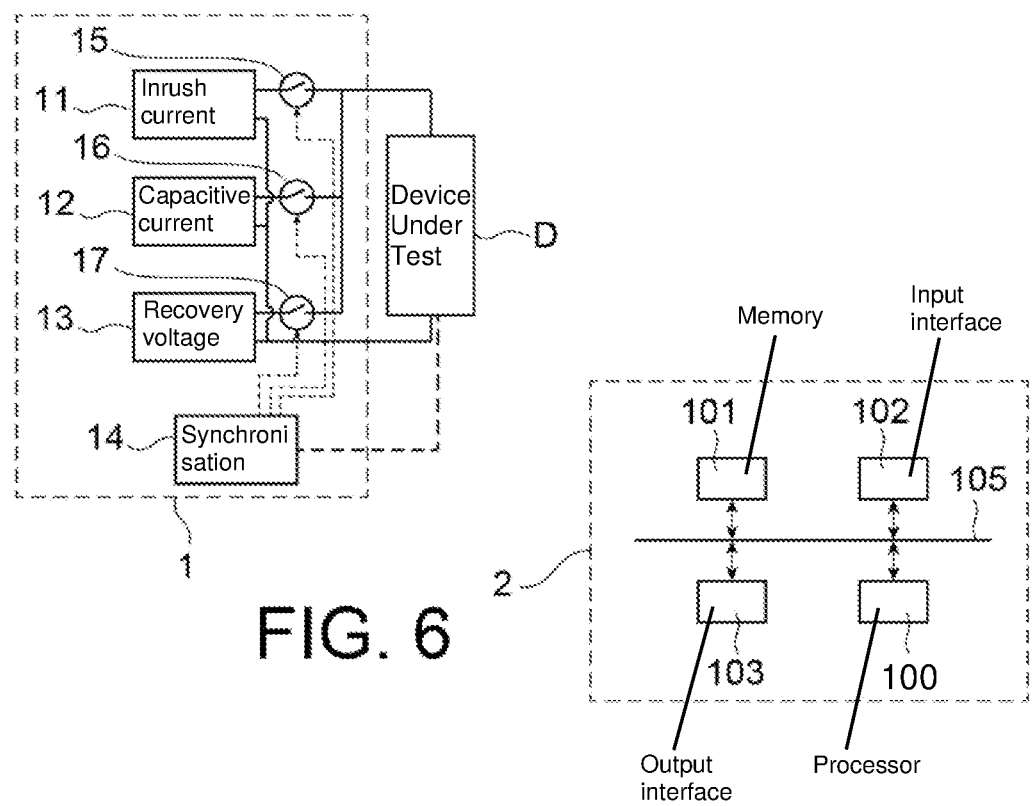
FIG. 6 illustrates the station for testing capacitive current switching of a circuit breaker, according to an embodiment of the invention.

Referring to FIG. 6, the station for testing capacitive current switching of a circuit breaker comprises a capacitive test station 1 and a data acquisition and processing chain 2 for performing measurements with high accuracy. To simplify the figure, the links between the capacitive test station 1 and the data acquisition and processing chain 2 have not been represented. Likewise, the test station is equipped with voltage measurement sensors that are not represented.

The capacitive test station 1 of the test station is of synthetic type. That means that a medium- or high-voltage network or a power station is not used, but an experimental device is used which synthesizes the voltage and current characteristics during an operation of opening and of closure of such a network.

The capacitive test station 1 comprises the following elements:
- an electrical module 11 for creating the inrush current,
- an electrical module 12 for creating the capacitive current,
- an electrical module 13 for creating the recovery voltage after a capacitive switching,
- a synchronisation module 14.

The electrical modules 11, 12 and 13 are linked to a circuit breaker under test D via respective contactors or medium- or high-voltage circuit breakers 15, 16 and 17. The electrical module 11 for creating the inrush current comprises a voltage source, a capacitive bank and an inductive bank. The capacitive bank comprises capacitors assembled in series and/or in parallel to obtain a capacitance value C required for the test. The inductive bank comprises inductors assembled in series and/or in parallel to obtain an induction value L required for the test. The capacitors are charged to the rated peak voltage Vc of the network: $Vc=Va \times (2/3)^{0.5}$, in which Va is the voltage retained for the test, for example a standardised voltage.

Figure 7:
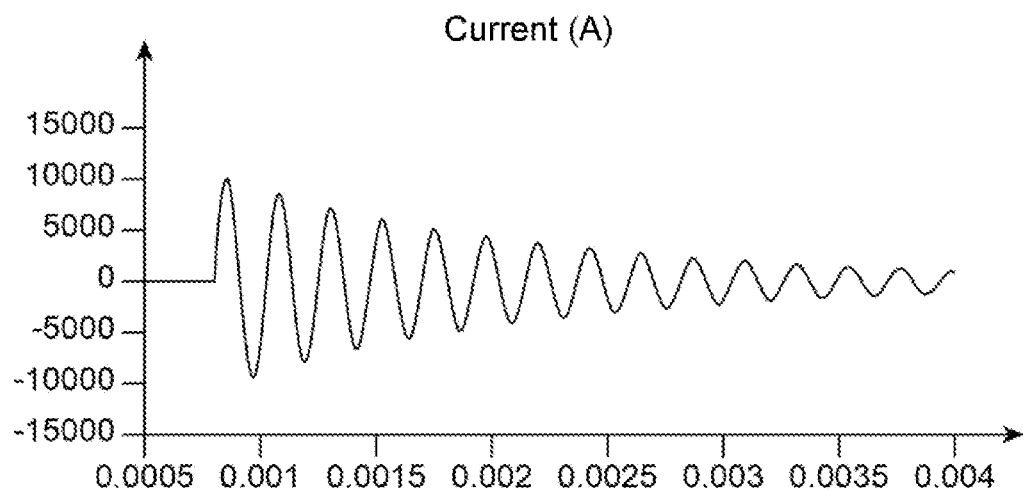
FIG. 7 illustrates an example of inrush current implemented in the context of the invention.

The capacitance value C and inductance value L of the inductive and capacitive banks are determined as follows:

$$C = Ic/Vc \times 1/(2\pi f) \quad [1]$$

$$L = Vc/Ic \times 1/(2\pi f) \quad [2]$$

in which Ic is the peak inrush current, Vc is defined above and f is the frequency. According to different variants, the inrush current value can be that recommended by the standards or a higher value or even a lower value. The frequency can be 4250 Hz as indicated in the standards or a value that is acceptable by the standards. An example of inrush current is represented in FIG. 7.

The electrical module 12 for creating the capacitive current is produced using a low-voltage circuit, for example of a few hundreds of volts. The function of this module is to create a 50 or 60 Hz wave. According to different variants, the capacitive current value is that recommended by the standards, or a higher value or even a lower value. The wave is produced by charging a capacitor and by discharging it through an inductor. The capacitance and inductance values are determined by using equations similar to the equations [1 & 2].

Figure 8:
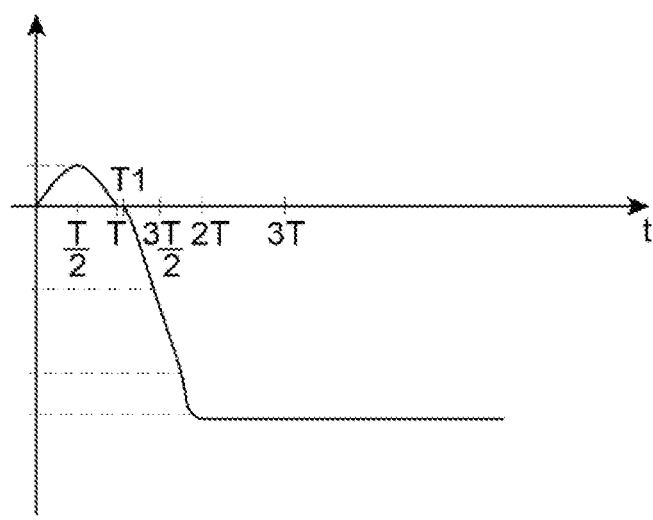
FIG. 8 illustrates an example of capacitive current and of recovery voltage implemented in the context of the invention.

An example of capacitive current is represented in FIG. 8. The capacitive current is a half-sinusoid between the instants t=0 and t=T.

Figure 9:
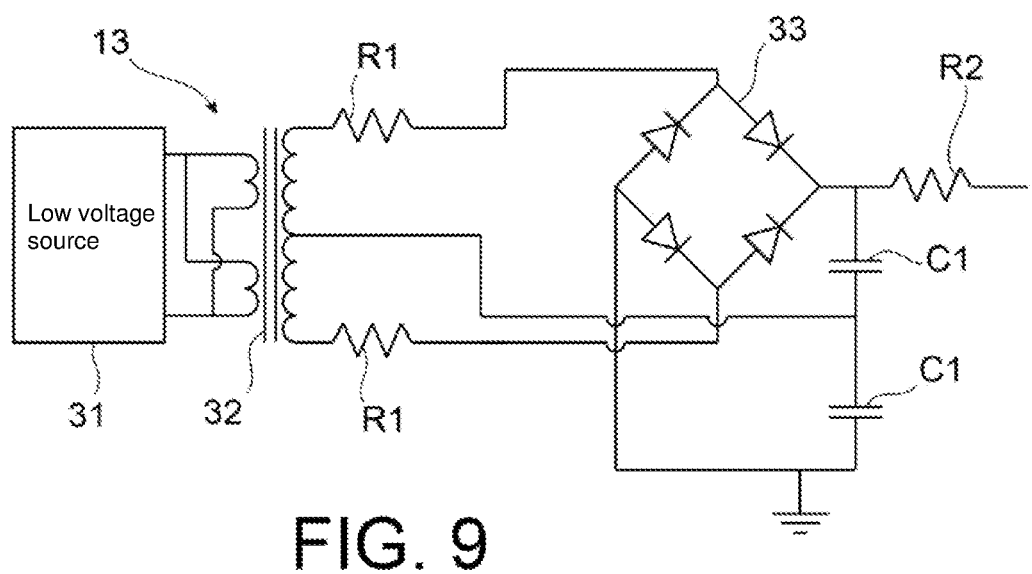
FIG. 9 illustrates an electrical module for creating a recovery voltage, in the station for testing capacitive current switching of a circuit breaker of FIG. 6.

The electrical module 13 for creating the recovery voltage is represented in FIG. 9. The function of this module is to create a recovery voltage greater than or equal to that of a capacitive test.

This module takes account of a particular point of the standards: during the first quarter period (5 ms at 50 Hz, 4.2 ms at 60 Hz), the re-ignitions are acceptable.

The electrical module 13 for creating the recovery voltage comprises, first of all, a source 31 of low voltage with adjustable amplitude and frequency.

FIG. 8 also represents the recovery voltage, which appears from an instant T1 of injection of the recovery voltage, the instant being later than the instant T previously defined. From the instant T1, the recovery voltage exhibits a rising edge than stabilises at a plateau value.

The adjustment of the frequency makes it possible to adjust the rate of voltage rise. Thus, it is possible to increase the rate of voltage rise by increasing the frequency. The source 31 therefore makes it possible to obtain a rapid voltage rise edge, this edge being able to be more rapid than that obtained in a capacitive test performed with a power station. By increasing the voltage, it is possible to increase the value of the voltage in the plateau part of the voltage curve of FIG. 8.

The output of the source 31 of low voltage with adjustable amplitude and frequency is linked to the input of a medium voltage or high voltage step-up transformer 32. The step-up transformer 32 can be a centre tap step-up transformer (called "Latour") which produces a voltage which is twice the voltage which is applied to it.

As a variant, it is possible to use several step-up transformers to obtain the desired power.

The output of the step-up transformer 32 is linked to load resistors R1, which serve as protection in case of fault.

The load resistors R1 are linked to the input of a rectifying circuit 33 such as a Graetz rectifier bridge.

The output of the Graetz rectifier bridge is linked to one or more filtering capacitors C1 and one or more current limiting resistors R2.

The filtering capacitor C1 filters the voltage obtained and eliminates the frequency of the source of low voltage with adjustable amplitude and frequency. The current limiting resistor R2 limits the peak breakdown voltage. For example, the resistance is 6.25 MOhms.

The synchronisation module 14 synchronises the electrical modules 11, 12 and 13. It is produced using a programmable logic controller or a computer. Thus, the recovery voltage is applied immediately after the capacitive current with a control less than a hundred or so microseconds. Recovery voltage level controls are performed after the capacitive current zero to check the validity of the opening test. An example of synchronisation is represented in FIG. 8, in which the instant T1 of injection of the recovery voltage is just after the instant T where the capacitive current is cancelled.

Referring once again to FIG. 6, the data acquisition and processing chain 2 has the general structure of a computer. It notably comprises a processor 100 running a computer program implementing the method according to the invention, a memory 101, an input interface 102 and an output interface 103.

These various elements are conventionally linked by a bus 105.

The input interface 102 is linked to the voltage sensors and is intended to receive the measured quantities.

The processor 100 executes the processes explained above. These processes are realised in the form of code instructions of the computer program which are stored by the memory 101 before being executed by the processor 100.

The memory 101 stores the measured values, the reference values and the diagnoses made. The memory 101 can be split into different parts to separate the instructions, the reference values and the measured values.

The output interface 103 is, for example, linked to a human-machine interface.

The invention claimed is:

1. A method for testing capacitive current switching of a circuit breaker including a station for capacitive current switching of the circuit breaker, the station including an electrical module to create an inrush current, an electrical module to create a capacitive current, an electrical module to create a recovery voltage after the capacitive current switching, and a synchronisation module to synchronise the electrical modules, the method comprising:
performing a capacitive current switching of the circuit breaker by using the electrical module to create an inrush current, the electrical module to create a capacitive current, the electrical module to create a recovery voltage after the capacitive current switching, and the synchronisation module to synchronise the electrical modules,
measuring voltage at the terminals of the circuit breaker after the capacitive current switching,
calculating the gradient of the measured voltage,
determining whether there is at least one point of gradient whose amplitude exhibits an absolute value greater than a first predetermined threshold, and when such a point is determined,
identifying the instant of appearance of the determined point and of the amplitude of variation of the voltage at that instant, as voltage drop.

2. The method for testing capacitive current switching of a circuit breaker according to claim 1, wherein the voltage is measured with a sampling frequency greater than 10 MHz.

3. The method for testing capacitive current switching of a circuit breaker according to claim 1, wherein calculating the gradient of the measured voltage comprises a high-pass filtering of the measured voltage.

4. The method for testing capacitive current switching of a circuit breaker according to claim 1, the circuit breaker comprising several phases, the method being performed for each phase, the method further comprising:
performing the measuring, calculating, determining, and identifying for each phase,
interpolating the voltage measurement values at the terminals of the circuit breaker after the instant of voltage drop, to obtain a voltage curve, for each phase,
calculating a recharge time of the voltage curve obtained, for each phase,
comparing the recharge time of the voltage curve obtained with a predetermined recharge time, for each phase, and
identifying a phase for which there is a match between the calculated recharge time and the predetermined recharge time.

5. The method for testing capacitive current switching of a circuit breaker according to claim 1, the circuit breaker comprising several phases, the method being performed for each phase, the method further comprising:
performing the measuring, calculating, determining, and identifying for each phase,
comparing the absolute value of the amplitude of gradient for each point determined for each phase, with a second predetermined threshold, and
identifying a phase for which the absolute value of the amplitude of gradient at the determined point is greater than the second predetermined threshold.

6. A station for testing capacitive current switching of a circuit breaker, comprising:
electrical modules suitable for carrying out a capacitive current switching by the circuit breaker, the electrical modules including an electrical module configured to create an inrush current, an electrical module configured to create a capacitive current, an electrical module configured to create a recovery voltage after the capacitive current switching, and a synchronisation module configured to synchronise the electrical modules, and
a data acquisition and processing chain suitable for measuring the voltage at the terminals of the circuit breaker after the capacitive current switching, to calculate the gradient of the measured voltage, to determine whether there is at least one point of gradient whose amplitude exhibits an absolute value greater than a first predetermined threshold, and when such a point is determined, and to identify the instant of appearance of the determined point and the amplitude of variation of the voltage at that instant, as voltage drop, and
wherein the data acquisition and processing chain is a computer for executing a computer program comprising instructions for executing the method according to claim 1.

7. The station for testing capacitive current switching according to claim 6, comprising a storage medium on which the computer program is stored.

8. A station for testing capacitive current switching of a circuit breaker, comprising:
electrical modules suitable for carrying out a capacitive current switching by the circuit breaker, the electrical modules including an electrical module configured to create an inrush current, an electrical module configured to create a capacitive current, an electrical module configured to create a recovery voltage after the capacitive current switching, and a synchronisation module configured to synchronise the electrical modules, and
a data acquisition and processing chain suitable for measuring the voltage at the terminals of the circuit breaker after the capacitive current switching, to calculate the gradient of the measured voltage, to determine whether there is at least one point of gradient whose amplitude exhibits an absolute value greater than a first predetermined threshold, and when such a point is determined, and to identify the instant of appearance of the determined point and the amplitude of variation of the voltage at that instant, as voltage drop.

9. The station for testing capacitive current switching of a circuit breaker according to claim 8, wherein the electrical module for creating the recovery voltage after a capacitive switching comprises a source of low voltage with adjustable amplitude and frequency, a step-up transformer and a rectifying circuit.

* * * * *